United States Patent [19]

Beckham et al.

[11] Patent Number: 4,962,294

[45] Date of Patent: Oct. 9, 1990

[54] METHOD AND APPARATUS FOR CAUSING AN OPEN CIRCUIT IN A CONDUCTIVE LINE

[75] Inventors: Keith F. Beckham, Wallkill; David C. Challener, Hopewell Junction; Arunava Gupta, Valley Cottage; Joseph M. Harvilchuck, Billings, all of N.Y.; James M. Leas, Bethesda, Md.; James R. Lloyd, Natick, Mass.; David C. Long; Horatio Quinones, both of Wappingers Falls, N.Y.; Krishna Seshan, Beacon; Morris Shatzkes, Monsey, both of N.Y.

[73] Assignee: International Business Machines Corporation, Armonk, N.Y.

[21] Appl. No.: 322,955

[22] Filed: Mar. 14, 1989

[51] Int. Cl.5 ........................................... B23K 26/00
[52] U.S. Cl. ........................ 219/121.68; 219/121.69; 219/234
[58] Field of Search ............... 219/121.68, 121.69, 219/121.83, 121.34, 121.19, 121.20, 234

[56] References Cited

U.S. PATENT DOCUMENTS

| | | | |
|---|---|---|---|
| 3,311,736 | 3/1967 | Burton et al. | 219/234 |
| 3,388,461 | 6/1968 | Lins | 219/121.62 X |
| 3,597,579 | 8/1971 | Lumley | 219/121.6 |
| 3,842,495 | 10/1974 | Bennett et al. | 219/121.69 X |
| 3,889,272 | 6/1975 | Lou et al. | 219/121.62 X |
| 4,085,022 | 4/1978 | Wechsunq et al. | 219/121.34 X |
| 4,284,872 | 8/1981 | Graeme | 219/121.62 X |
| 4,358,659 | 11/1982 | Spohnheimer | 219/121.68 |
| 4,553,021 | 11/1985 | Conti | 219/234 |
| 4,582,976 | 4/1986 | Merrick | 219/121.69 |
| 4,824,366 | 4/1989 | Hohmann et al. | 219/234 |

FOREIGN PATENT DOCUMENTS

1020869· 5/1983 U.S.S.R. .................. 29/610.1

Primary Examiner—C. L. Albritton
Attorney, Agent, or Firm—Jeffrey L. Brandt

[57] ABSTRACT

A method for causing an open circuit in an electrical conductor is provided, including the steps of: conducting a direct current through the conductor; and applying heat at a selected location on the conductor whereat it is desired to cause the open circuit of the conductor.

36 Claims, 3 Drawing Sheets

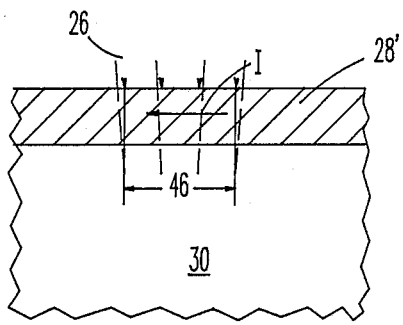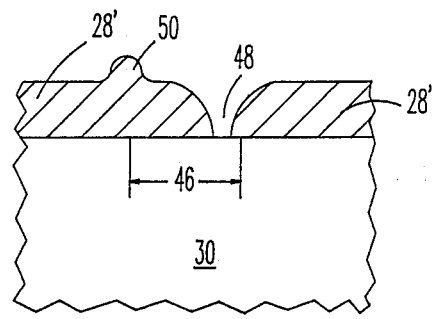
FIG.2A  FIG.2B
FIG.2
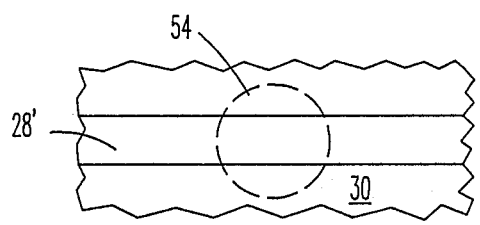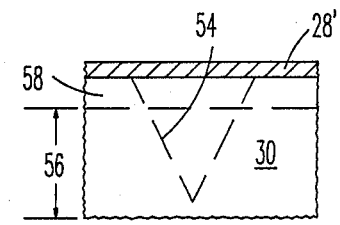
FIG.3A  FIG.3B
FIG.3
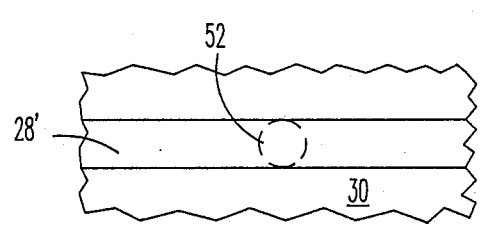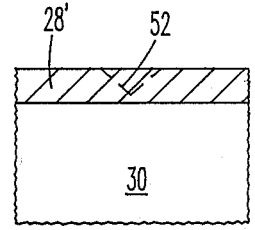
FIG.4A  FIG.4B
FIG.4

METHOD AND APPARATUS FOR CAUSING AN OPEN CIRCUIT IN A CONDUCTIVE LINE

The present invention relates generally to a method and apparatus for causing an open circuit in a conductive line, and more particularly to a method and apparatus for effecting such an open circuit on a semiconductor device.

BACKGROUND OF THE INVENTION

In many semiconductor processing environments, it is necessary to sever, or "open circuit", selected conductive lines on a semiconductor chip or substrate. The analysis of a failed semiconductor chip, for example, often requires that selected conductors be open circuited so that suspected failing structures are electrically isolated from surrounding circuits. This isolation permits examination of the suspected defective part devoid of electrical interference from the surrounding electronics.

Another example of an application utilizing the open circuiting of conductive lines is that of isolating known bad circuits and/or components on an otherwise operable semiconductor chip. Such utilization can result in a substantial yield improvement for devices such as memories wherein inoperable circuits can be physically and logically isolated to provide a good device.

As advanced semiconductor manufacturing techniques permit the construction of smaller, more densely packed structures, the isolation and open circuiting of selected conductors becomes increasingly difficult. Very large scale integrated circuits (VLSI), for example, may include conductors sized on the order of 0.7 microns, and these conductors can be spaced at intervals of 0.7 microns. Thus, very delicate processes are necessary to isolate and open circuit a single one of these conductors.

Currently, several processes are known for open circuiting conductors on semiconductor chips, including: photolithographic masking with chemical etching, high-power laser cutting, and mechanical polishing or scribing. Each of these processes, however, is known to exhibit substantial disadvantages.

The use of photolithographic masks and chemical etching of the conductor is a slow, complex process requiring multiple processing steps. Further, it is difficult to isolate only the desired conductor, and difficult to limit the extent of the etching.

The use of high power lasers can cause damage to both underlying and surrounding structures. More particularly, the intensity of the power required to vaporize the conductive lines makes it extremely difficult to terminate the laser after vaporizing a line before substantial damage is done to the underlying substrate. Further, the conductive material vaporized by the laser can contaminate other regions on the substrate.

Mechanical scribing and polishing is difficult to control to the necessary tolerances, and can cause damage to surrounding circuits.

U.S. Pat. No. 3,597,579 to Lumley shows a method of laser trimming a capacitor while maintaining an electrical potential between the capacitor plates so as to inhibit the formation of electrical shorts.

U.S. Pat. No. 4,582,976 to Merrick shows a method of laser trimming a resistor in a temperature compensating resistive circuit.

U.S. Pat. No. 4,358,659 to Spohnheimer shows a method of maintaining a laser beam in focus on the surface of a semiconductor circuit.

None of these patents show or suggest a desirable means for open circuiting a selected conductor on a semiconductor substrate.

SUMMARY OF THE INVENTION

The principle object of the present invention is to provide a new and improved means for causing an open circuit in a selected conductor.

Another object of the present invention is to provide such a means for causing an open circuit which is particularly suited for use on semiconductor chip lines.

A further object of the present invention is to provide such a means for causing an open circuit which is particularly suited for use on very small, closely spaced conductors.

In accordance with the present invention, a new and improved method for causing an open circuit in an electrical conductor is provided, comprising the steps of: providing the conductor having a cross-sectional area in the range of about 0.05–1500 square microns; conducting a direct current through the conductor, the direct current being of a magnitude less than that required to vaporize the conductor; and applying heat at a selected location on the conductor whereat it is desired to cause the open circuit of the conductor, the heat being less than that required to vaporize the conductor; whereby the conducting and applying steps together effect an open circuit in the conductor.

In accordance with another aspect of the present invention, a new and improved apparatus is provided for cuasing an open circuit in an electrical conductor, comprising: said conductor having a cross-sectional area in the range of about 0.05–1500 square microns; means for conducting a direct current through the conductor, the direct current being of a magnitude less than that required to vaporize the conductor; and means for applying heat at a selected location on the conductor whereat it is desired to cause the open circuit of the conductor; the heat being less than that required to vaporize the conductor; whereby the conducting and applying means together effect an open circuit in the conductor.

In accordance with yet another aspect of the present invention, there is provided a probe, comprising: a body; a first conductor supported on the body; a second conductor insulated from the first conductor and supported on the body generally opposite the first conductor; and means for conducting light energy to the area between the first and second conductors; whereby the probe is positionable on a third conductor so as to conduct a current through the first, second, and third conductors while applying light energy to the third conductor.

BRIEF DESCRIPTION OF THE DRAWINGS

Further objects, features, and advantages of the present invention will become apparent from a consideration of the following detailed description of the invention when read in conjunction with the drawing Figures, in which:

FIG. 2 is a cross-sectional view of the semiconductor chip of FIG. 1 showing the conductor before (FIG. 2A) and after (FIG. 2B) the open circuit is formed;

FIG. 3 includes top (FIG. 3A) and cross-sectional (FIG. 3B) views illustrating one method of focusing a laser beam in accordance with the present invention;

FIG. 4 includes top (FIG. 4A) and cross-sectional (FIG. 4B) views illustrating an alternate method of focusing a laser beam in accordance with the present invention;

DETAILED DESCRIPTION OF THE INVENTION

Figure 1:
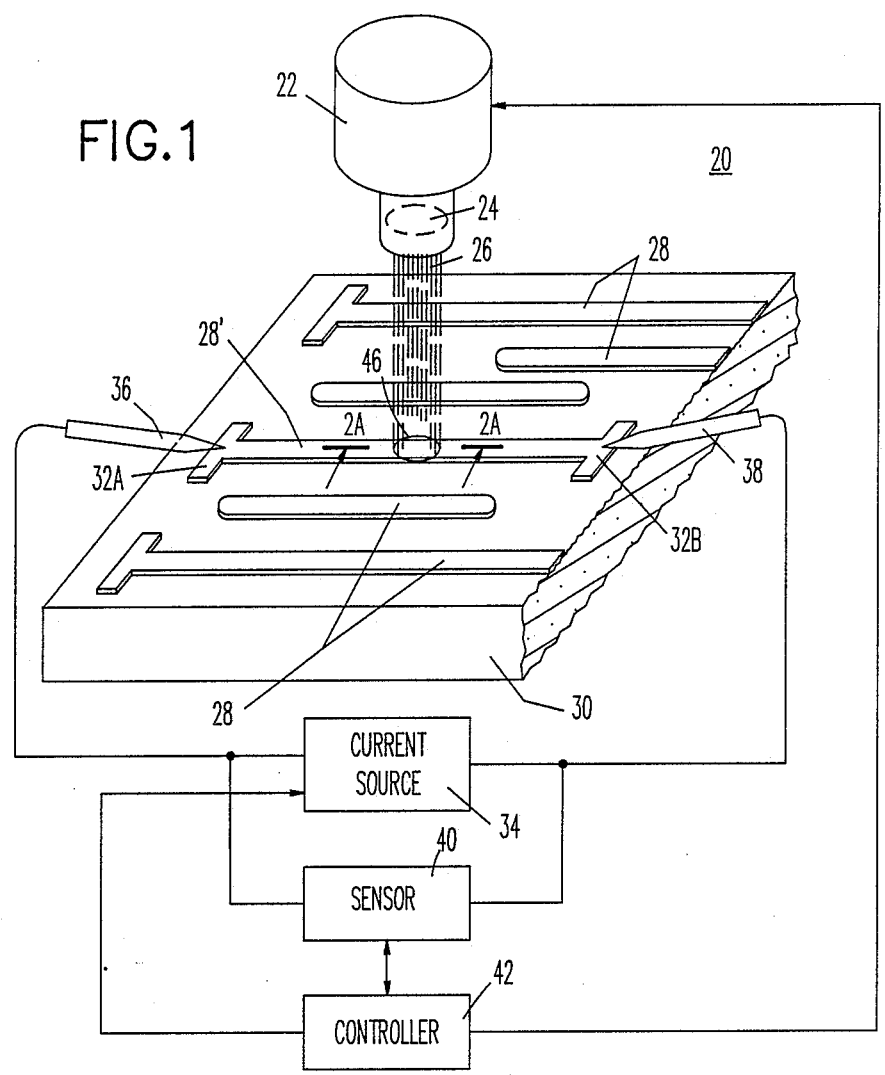
FIG. 1 is a perspective view, partly in block diagram, showing a system constructed in accordance with the present invention.

Referring now to the drawings, FIG. 1 shows a perspective view of a system 20 including a laser 22 having a mechanism 24 for focusing radiant energy 26 onto a conductor 28'. Conductor 28' comprises a selected one of many closely spaced conductive lines 28 situated on a semiconductor chip 30, the chip and conductive lines being shown enlarged. In a manner well known to those skilled in the art, conductors 28, 28' are typically positioned so as to connect nnd interconnect structures (not shown) such as transistors and resistors fabricated in/on chip 30. Conductor 28' is seen to include two relatively larger conductive pads 32A, 32B situated at opposite ends thereof.

System 20 further includes a D.C. current source 34 and a pair of probes 36, 38 connected to the current source and positioned in contact with pads 32A, 32B of conductor 28', respectively. A sensor 40 for measuring the resistance through line 28' is connected across current source 34 to probes 36, 38. Sensor 40 comprises, for example, an approximately connected ohmeter, voltmeter, or ammeter. A controller 42 is connected to receive the output of sensor 40 and control the operation of laser 22 and current source 34 in a manner described in detail below.

For purposes of illustrating the present invention, it will be assumed that it is desired to cause an open circuit in conductor 28' at a location indicated at 46, and that this open circuit must be formed without damaging adjacent conductors 28 or the underlying components (not shown) in chip 30. FIG. 2A shows a cross-sectional view of conductor 28' before the open circuit is formed.

In accordance with the present invention, current source 34 is operated so as to conduct a D.C. current I through conductor 28' via probes 36, 38. While current I is flowing through conductor 28', laser 22 and focusing mechanism 24 are operated so as to focus laser energy 26 generally onto region 46, raising the temperature of the conductor thereat. Sensor 40 is operated so as to monitor the resistance through conductor 28'.

The present inventors have discovered that, through the use of D.C. current I in combination with the local heating in conductor 28' caused by laser energy 26, a reliable open circuit can be formed in the conductor in a relatively shor period of time. Further, the open circuit is formed with virtually no damage to the surrounding or underlying structure. When sensor 40 senses a high resistance through conductor 28', indicating the open circuit has been formed, controller 42 is operated so as to terminate the operation of laser 22 and current source 34. Conductor 28', with an open circuit 48, is shown in FIG. 2B.

Though it is not necessary to the practice of the present invention to understand the operative mechanism therein, the inventors have theorized that the open circuit is formed by the action known as electromigration. In a conductor such as line 28', electromigration comprises a drift of atoms initiated during a current flow. The provision of locally concentrated heat, i.e. the heat supplied to region 46 by laser 22, is believed to cause a divergence in the flux of the conductor atoms. This divergence in the flux causes more atoms to drift outward of one side of heated region 46 than drift into that side. The result is open circuit 48 at one side of heated region 46, and a characteristic hillock 50 of conductive material at the other side (FIG. 2B).

With reference to system 20 described above, conductors 28, 28' can comprise any electrically conductive material, including but not limited to: metals, polysilicons and doped polysilicons, and polycides (polysilicon covered with a metal silicide). Laser 22 can comprise any means for heating a localized area to the appropriate temperature range, including an ion beam generator, and resistance heating means (one example of which is shown below). Semiconductor substrate 30 can comprise any semiconductor material: silicon or gallium arsenide, for example.

In the broader sense, it will be understood that the present invention is not limited to semiconductor processing. However, the present inventors have determined its operability for semiconductor processing environments, including the open circuiting of conductors with cross-sectional areas in the range of about 0.05–1500 square microns. Such conductors can be open circuited using the present invention with a current I in the range of about $1 \times 10^5 - 1 \times 10^7$ amp/cm$^2$, and a temperature of less than the melting point of the current-carrying conductor. This temperature is obtained from the joule-heating (provided by current I), in combination with the application of the localized heat source (eg. laser 22) to a conductor length approximately equal to the square root of the conductor cross-sectional area.

While one example is set out below, the selection of the current, temperature, and heated area parameters described above are made based on the desired results. Factors to consider include, but are not limited to: the time in which it is desired to effect the open circuit, the desired size of the open circuit, the spacing of adjacent conductors and/or other frangible structures, the composition of the supporting substrate (if any is used), and the source of the heat energy. Within these guidelines, many variations of the factors taught above will be readily apparent to those skilled in the art.

For purposes of example, the present invention has been practiced to cause open circuits in a 15 micron wide (about 75 micron square) aluminum line formed over a silicon substrate. An Argon laser adjusted to have a beam intensity of approximately 1.6 watts was focused on the line. When a current of approximately 0.375 amps was passed through the aluminum line, an open circuit was caused in about five minutes. When a current of approximately 0.5 amps was used, an open circuit was caused in about 50 seconds. With the laser beam focused on the conductor, virtually no change or harm was effected in the surrounding structure. When only the laser or the current described above was applied to the same conductor for a duration of about five minutes, no open circuit was caused.

Referring now to FIGS. 3 and 4, when a laser having a wavelength absorbable by semiconductor substrate 30, such as an Argon laser, is used to provide the localized heating described above, the present inventors have determined that the laser energy may cause some damage to surrounding structures if it is not focused substantially entirely onto the conductor 28'. Therefore, when a laser beam having a wavelength absorbable by substrate 30 is used to practice the present invention, it is best focused on a small region 52 within conductor 28' in the manner shown in FIG. 4.

It will be appreciated that the laser energy required to practice the present invention is substantially less than that of the high-power lasers of the prior art discussed above. Pursuant to the practice of the present invention, the laser energy can thus be readily terminated, after the conductive line has been open circuited, before any damage is done to the underlying substrate or structures. Further, because the open circuit is formed by electromigration, versus the vaporization of the prior art, there is no vaporized metal to be concerned with. The present invention is thus not subject to the disadvantages of severe substrate damage and/or metal vapor contamination typical of the prior art.

In accordance with another aspect of the present invention, it has been discovered that a laser having a wavelength in the red or infra-red ranges can be beneficially used in the practice of the invention on semiconductor chips, including silicon and gallium arsenide semiconductor chips. Such a laser generates energy to which semiconductor substrate 30 is substantially transparent, the energy still being absorbed by overlying conductor 28' so as to create the necessary, localized heating. When such a laser is used, the beam focus is not as critical, and can be done, in the manner shown at 54 in FIG. 3, so as to overlap the edges of conductor 28'. Silicon, for example, is effectively transparent to light having a wavelength greater than about 1.36 microns, and any energy which is absorbed by substrate 30 will be absorbed harmlessly at a depth 56 below the active region 58.

The present inventors have further determined that, where it is practical, the conductor to be open circuited can beneficially be coated or otherwise processed so as to tint its surface color to more readily absorb the laser energy. The use of a laser having a wavelength to which the substrate is generally transparent relative to the conductor, and the resultant decrease in the criticality of the focus, makes the invention easier and more economical to practice.

Figure 5:
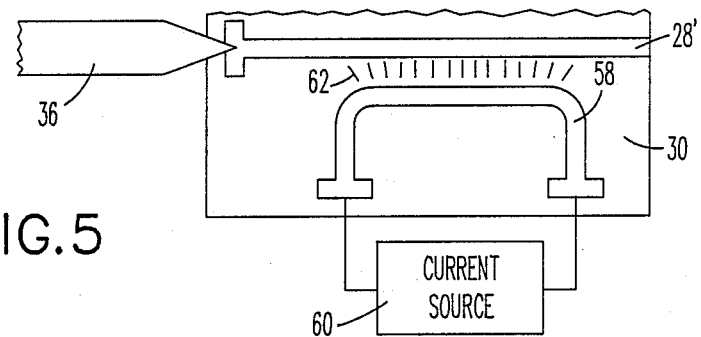
FIG. 5 is a top view of a semiconductor chip illustrating one method of providing resistance heat in accordance with the present invention.

Referring now to FIG. 5, another aspect of the present invention is shown wherein the local heating is provided by resistance heat. When it is known during the semiconductor manufacturing process that it is likely conductor 28' will be open circuited at a later time, a resistive heating element in the form of a U-shaped conductor 58 is fabricated with its end adjacent to the conductor. A current, from a source 60, can then be conducted through element 58, so as to generate resistive heat 62 proximate conductor 28'. A current (not shown in FIG. 5) is then conducted through conductor 28' to cause an open circuit in the manner described above.

Figure 6:
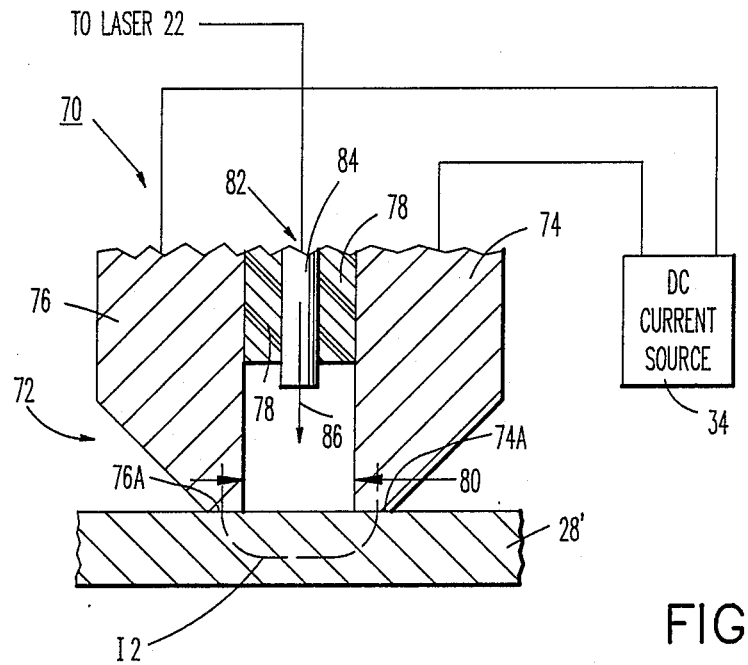
FIG. 6 is a cross-sectional view of a probe adapted for the practice of the present invention.

Referring now to FIG. 6, in accordance with yet another aspect of the present invention, a probe 70 is provided including a tip portion 72 adapted to facilitate the practice of the present invention. Probe 70 includes a pair of electrical conductors 74, 76 supported by an electrically insulating medium 78 so as to be spaced apart a predetermined distance 80. Conductors 74, 76 terminate in end portions 74A, 76A at probe tip 72, these end portions being sized and positioned so as to be capable of conducting an electrical current I2 through a selected location of a generally planar conductor such as the conductor 28'.

Probe 70 further includes a hollow channel 82, extending at least through tip portion 72, the channel being sized and shaped so as to support an optical fiber 84 for conducting light energy 86 generally parallel to and between probe conductor ends 74A, 76A.

In operation, probe conductors 74, 76 are connected to current source 34, while optical fiber 84 is connected to laser 22. Probe tip 72 is then applied to a selected location on conductor 28' so as to simultaneously conduct current I2 through the location while applying laser energy 86 thereat. An open circuit can thus be caused at the selected location in conductor 28' in accordance with the method described above.

Figure 7:
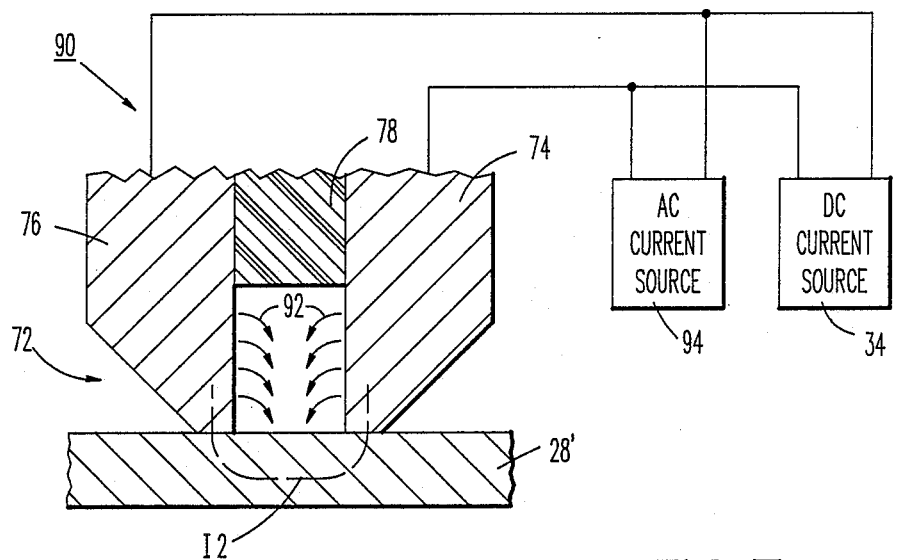
FIG. 7 is a cross-sectional view of another probe adapted for the practice of the present invention.

Referring now to FIG. 7, a probe 90 is shown which is substantially identical in construction to probe 70, with the exception that the optical fiber and supporting channel have been omitted. In their stead, radiant heat energy 92 is provided to conductor 28' via an A.C. current source 94 connected across conductors 74, 76. Controlling the amplitude of A.C. current source 94 controls the temperatures of conductors 74, 76, and hence of radiant heat 92, while not otherwise substantially affecting the formation of the desired open circuit. Controlling the magnitude of D.C. current source 34, of course, affects the formation of the desired open circuit in the manner described hereinabove.

It will be appreciated that probes 70 and 90 provide a particularly convenient apparatus for practicing the present invention, and can be constructed in varying sizes and configurations depending, for example, on the size and shape of the conductor in which an open circuit is to be effected.

There is thus provided a new and improved method and apparatus for causing an open circuit at a selected location in an electrical conductor through the simultaneous application of D.C. current and heat energy. The invention is straightforwardly performed with conventional equipment. The current can be applied at convenient locations, remote from the point at which the open circuit is to be effected. The heat required is relatively low temperature, and can be selected to be of a wavelength whereat it will not damage surrounding structures and hence needn't be too finely focused.

The resulting open circuit is cleanly and efficiently effected with little or no disturbance to surrounding structures. Further provided are probes particularly suitable to the practice of the present invention. The invention has particular application in the processing of semiconductor devices.

While the present invention has been described with respect to specific embodiments, numerous modifications, changes, and improvements will be apparent within the spirit and scope of the present invention.

What is calimed is:

1. A method for causing an open circuit in an electrical conductor, comprising the steps of:
   providing said conductor having a cross-sectional area in the range of about 0.05–1500 square microns;
   conducting a direct current through said conductor, said direct current being of a magnitude less than that required to vaporize said conductor; and applying heat at a selected location on said conductor whereat it is desired to cause the open circuit of said conductor, said heat being less than that required to vaporize said conductor;

whereby said conducting and applying steps together effect an open circuit in said conductor.

2. A method in accordance with claim 1 wherein said conducting step includes conducting a current in the range of about $1 \times 10^5 - 1 \times 10^7$ amperes/cm$^2$ 3. A method in accordance with claim 3 wherein said applying step includes applying heat at a temperature less than the melting point of said conductor carrying said current to a length of said conductor approximately equal to the square root of the cross-sectional area of the conductor.

4. A method in accordance with claim 1 wherein said conductor is situated on a supportive substrate.

5. A method in accordance with claim 5 wherein said substrate comprises a semiconductor substrate.

6. A method in accordance with claim 1 wherein said applying step includes impinging a laser beam onto said conductor.

7. A method in accordance with claim 1 wherein said applying step includes applying resistance heat to said conductor.

8. A method in accordance with claim 1 wherein said applying step includes impinging an ion beam onto said conductor.

9. A method in accordance with claim 1 wherein said conductor comprises a metal, a polysilicon, or a polycide.

10. A method in accordance with claim 4 wherein said heat is selected to have a wavelength which is absorbed more readily by said conductor than by said substrate.

11. A method in accordance with claim 5, wherein said heat is selected to comprise a laser beam having a wavelength generally in the red or the infrared ranges.

12. A method in accordance with claim 11 wherein said laser beam is directed so as to impinge on a larger area of said substrate than just that area occupied by said conductor.

13. A method in accordance with claim 6 wherein said laser beam is focussed onto said conductor such that substantially all of the energy in said laser beam is absorbed by said conductor.

14. A method in accordance with claim 6 and further including the step of tinting the surface of said conductor such that it is highly absorptive to the energy of said laser beam.

15. A method in accordance with claim 1 and further including the steps of:
monitoring the resistance through said conductor; and
automatically terminating said method when said monitoring step indicates said open circuit has been caused.

16. Apparatus for causing an open circuit in an electrical conductor, comprising:
said conductor having a cross-sectional area in the range of about 0.05–1500 square microns;
means for conducting a direct current through said conductor, said direct current being of a magnitude less than that required to vaporize said conductor; and
means for applying heat at a selected location on said conductor whereat it is desired to cause the open circuit of said conductor, said heat being less than that required to vaporize said conductor;
whereby said conducting and applying means together effect an open circuit in said conductor.

17. Apparatus in accordance with claim 16 wherein said direct current is in the range of about $1 \times 10^5 - 1 \times 10^7$ amperes/cm$^2$.

18. Apparatus in accordance with claim 17 wherein said heat is at a temperature less than the melting point of said conductor carrying said current and applied to a length of said conductor approximately equal to the square root of the cross-sectional area of said conductor.

19. Apparatus in accordance with claim 16 wherein said conductor is situated on a supportive substrate.

20. Apparatus in accordance with claim 18 wherein said substrate comprises a semiconductor substrate.

21. Apparatus in accordance with claim 16 wherein said applying means includes means for impinging a laser beam onto said conductor.

22. Apparatus in accordance with claim 15, wherien said applying means includes means for applying resistance heat to said conductor.

23. Apparatus in accordance with claim 16 wherien said applying means includes means for impinging an ion beam onto said conductor.

24. Apparatus in accordance with claim 16 wherein said conductor comprises a metal, a polysilicon, or a polycide.

25. Apparatus in accordance with claim 19 wherein said heat is selected to have a wavelength which is absorbed more readily by said conductor than by said substrate.

26. Apparatus in accordance with claim 20 wherien said heat is selected to comprise a laser beam having a wavelength generally in the red or the infra-red ranges.

27. Apparatus in accordance with claim 26 wherien said laser beam is directed so as to impinge on a larger area of said substrate than just that area occupied by said conductor.

28. Apparatus in accordance with claim 21 wherein said laser beam is focussed onto said conductor such that substantially all of the energy in said laser beam is absorbed by said conductor.

29. Apparatus in accordance with claim 21 wherein said conductor is tinted such that it is highly absorptive to the energy of said laser beam.

30. Apparatus in accordance with claim 16 and further including:
means for monitoring the resistance through said conductor; and
means for automatically terminating the operation of said apparatus for causing an open circuit when said monitoring means indicates said open circuit has been caused.

31. Apparatus in accordance with claim 16 wherein said conducting and applying means includes a probe, comprising:
a body;
a first conductor supported on said body;
a second conductor insulated from said first conductor and supported on said body generally opposite said first conductor; and
means for applying an A.C. current between said first and second conductors so as to produce radiant heat from said conductors;
whereby said probe is positionable on a third conductor so as to conduct a current through said first, second, and third conductors while applying said radiant heat to said third conductor.

32. Apparatus in accordance with claim 16 wherein said conducting and applying means include a probe, comprising:
a body;
a first conductor supported on said body;
a second conductor insulated from said first conductor and supported on said body generally opposite said first conductor; and
means for conducting light energy to the area between said first and second conductors;
whereby said probe is positionable on a third conductor so as to conduct a current through said first, second, and third conductors while applying light energy to said third conductor.

33. A probe comprising:
a body;
a first conductor supported on said body;
a second conductor insulated from said first conductor and supported on said body generally opposite said first conductor; and
means for conducting light energy to the area between said first and second conductors;
whereby said probe is positionable on a third conductor so as to conduct a current through said first, second, and third conductors while applying light energy to said third conductor.

34. The probe of claim 33 wherein said body defines a hollow interior passage.

35. The probe of claim 34 wherein said light energy conducting means includes an optical fiber supported in said passage.

36. The probe of claim 33 and further including means for applying a D.C. current between said first and second conductors.

* * * * *